United States Patent [19]
Kataoka et al.

[11] 3,938,110
[45] Feb. 10, 1976

[54] METHOD OF CONTROLLING MAGNETIC STRIP DOMAINS

[75] Inventors: Shoei Kataoka; Toshio Tsurushima, both of Tanashi; Yoshinobu Sugiyama, Akishima; Hisao Tanoue, Tanashi; Hideo Yamada, Kawasaki; Yasuo Komamiya, Yokohama, all of Japan

[73] Assignee: Agency of Industrial Science & Technology, Tokyo, Japan

[22] Filed: Feb. 5, 1974

[21] Appl. No.: 439,727

[30] Foreign Application Priority Data
Feb. 7, 1973  Japan.............................. 48-14613

[52] U.S. Cl. .................. 340/174 TF; 340/174 HA; 340/174 VB; 340/174 ZA
[51] Int. Cl.² ........................................ G11C 11/14
[58] Field of Search ............................ 340/174 TF

[56] References Cited
UNITED STATES PATENTS

| | | | |
|---|---|---|---|
| 3,699,547 | 10/1972 | Owens............................ | 340/174 TF |
| 3,710,356 | 1/1973 | Bobeck et al. ................. | 340/174 TF |
| 3,728,697 | 4/1973 | Heinz............................. | 340/174 TF |
| 3,810,131 | 5/1974 | Ashkin et al. .................. | 340/174 TF |

*Primary Examiner*—James W. Moffitt
*Attorney, Agent, or Firm*—Oblon, Fisher, Spivak, McClelland & Maier

[57] ABSTRACT

A method of controlling magnetic strip domains is disclosed wherein a magnetic material having at least one ion-implanted region is placed under a bias magnetic condition which permits magnetic strip domains to exist in said magnetic material and subjected to one or more control magnetic fields to thereby generate and/or control magnetic strip domains.

41 Claims, 40 Drawing Figures

Direction of rotating magnetic field
Domain
Ion-implanted region

Stretch length vs. Bias field

Implanted ion 120 keV $He^+$
Ion dose $5 \cdot 10^{15} cm^{-2}$
In-plane field
▲ 24.8 oe
△ 21.2 oe
○ 17.7 oe
● 14.5
Frequency of in-plane field 2 Hz Stretch length μm
Bias magnetic field oe

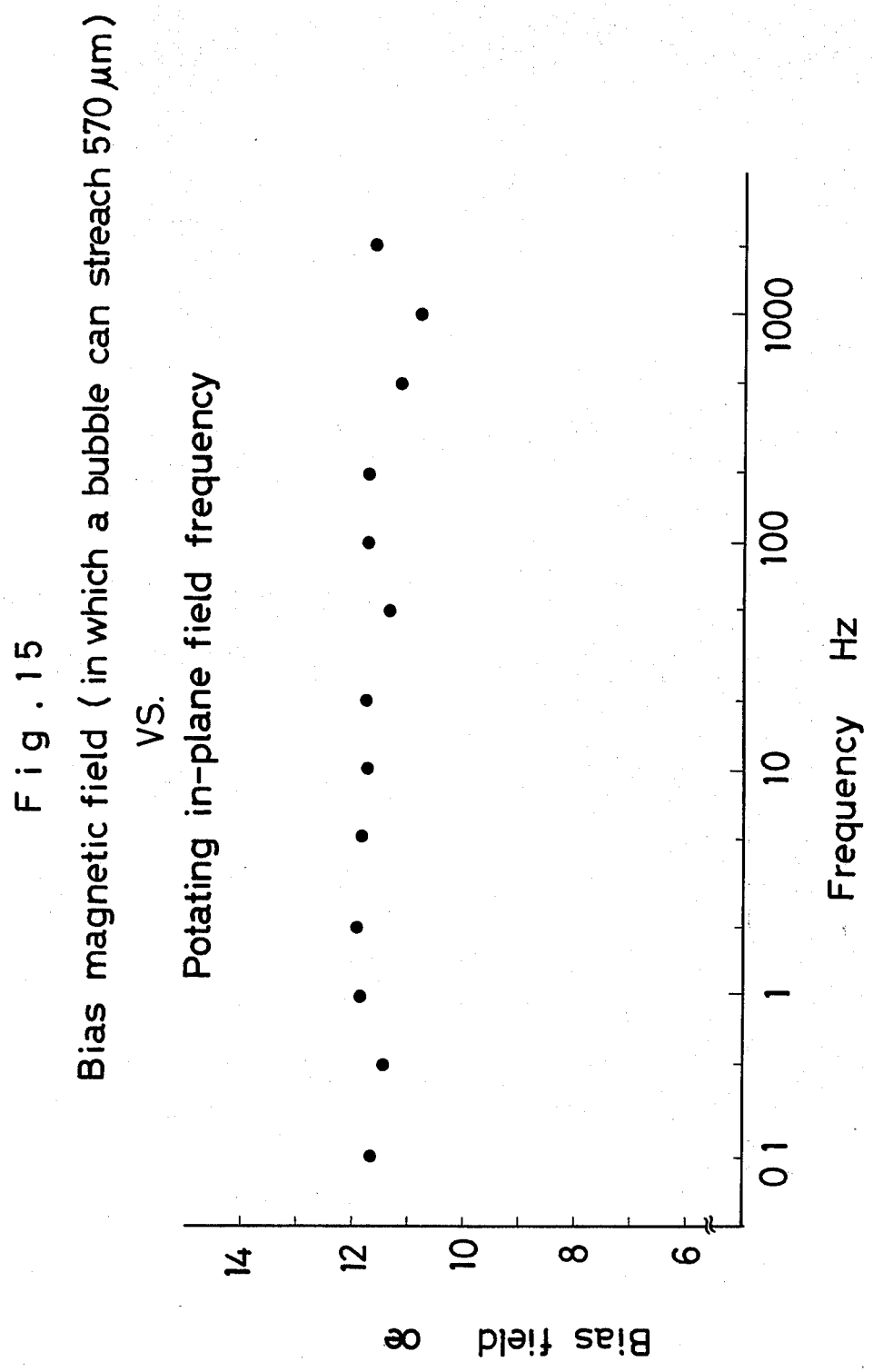

$\vec{Z} = x \cdot {\sim}y$ $\vec{Z} = x \cdot y$

METHOD OF CONTROLLING MAGNETIC STRIP DOMAINS

BACKGROUND OF THE INVENTION

The present invention relates to a method of controlling magnetic strip domains and, in particular to a method of generating, shifting, expanding, stretching, annihilating and detecting magnetic strip domains.

It is well known that, in ortho-ferrites or garnets, a portion in which the magnetizing direction is reversed locally can be produced and this portion is referred to as a magnetic domain. In particular, such a domain having a circular shape is referred to as a magnetic bubble domain and can be utilized as a high-density memory.

Although in addition to circular shaped magnetic bubble domains there have been known elongated magnetic domains referred to as "magnetic strip domains," there existed almost no means for applying such magnetic strip domains to a practical purpose. The sole application of such magnetic strip domains has been in the method of detecting magnetic bubble domain where the magnetic bubble domain to be detected is stretched into a magnetic strip domain in order to obtain a larger output.

One method of enlarging or stretching a bubble domain which has been considered as effective has been to provide Permalloy on the surface of the magnetic material in the shape of crossed I's (I) or in the shape of chevrons having increasingly larger numbers of chevron bars and to thereby progressively stretch or expand the bubble domain to a more easily detectable size. In this case, however, the surface of the magnetic material is made irregular by the presence of the Permalloy thereon. Further, in this case, the Permalloy overlay makes it difficult to provide on the surface conductive leads which may be necessary to shift and/or detect the magnetic bubble domain, because the Permalloy is conductive.

So far as the inventors know, there has been no method of maintaining a magnetic strip domain having a specific shape at a specific position in a magnetic material or controlling the magnetic strip domain in the magnetic material.

A primary object of the present invention is to provide a method of generating a magnetic strip domain at a specific position in a magnetic material and of shifting or rearranging arbitrarily.

Another object of the present invention is to provide a method of stretching or expanding a magnetic bubble domain to easily generate a magnetic strip domain or annihilating the magnetic strip domain.

A further object of the present invention is to provide a method of easily detecting not only the existence or absence of a magnetic strip domain but also the size and intensity thereof as well as the position, shape etc. thereof.

SUMMARY OF THE INVENTION

In order to achieve the above objects of the present invention, there is provided in the surface of a magnetic material such as ortho-ferrite or garnet a portion into which ions have been injected or implanted locally. When a magnetic field is not applied to the magnetic material, the magnetic pattern within the area along the boundary between the ion-implanted region and the unimplanted region is composed of magnetic strip domains in parallel to the boundary and that outside of the region is a maze pattern. When a rotating in-plane magnetic field is applied to the surface of the magnetic material, a convolute magnetic domain pattern is formed inside and outside of the boundary and, when a bias magnetic field is applied normal to the surface thereof, the magnetic strip domain is shifted along the boundary. When an alternating magnetic field is employed as the rotating in-plane magnetic field, the phenomenon of repeated production and extinction of magnetic strip domains can be observed. The present invention utilizes the phenomena mentioned above to control magnetic strip domains.

Other objects and characteristics of this invention will be explained in detail hereunder by referring to the accompanying drawing.

BRIEF EXPLANATION OF THE DRAWINGS

FIG. 15 is a diagram showing the relationship between the bias field in which a bubble is stretched 570$\mu$m and the frequency of the rotating in-plane field, FIG. 16, including 16A and 16B, shows the principle of magnetic strip domain detection according to the present invention.

DETAILED EXPLANATION OF THE INVENTION

Figure 1:
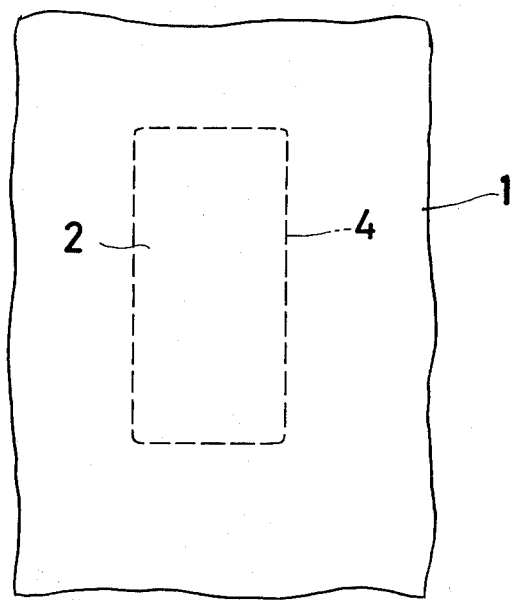
FIG. 1 is an explanatory illustration to show the fundamental principle of the present invention.
Figure 2:
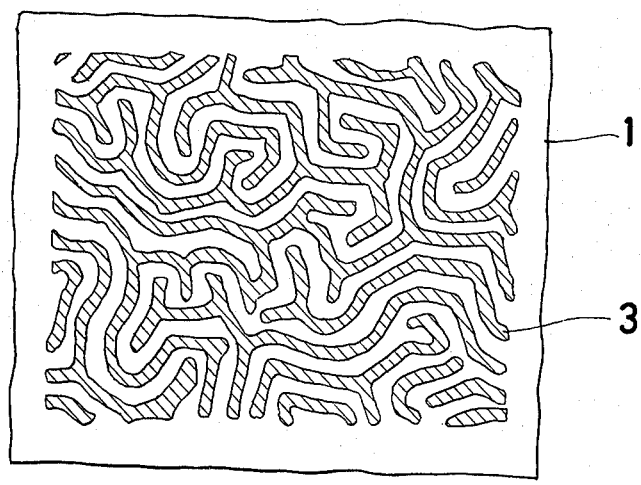
FIG. 2 shows an example of the magnetic strip domain pattern in a magnetic material.
Figure 3:
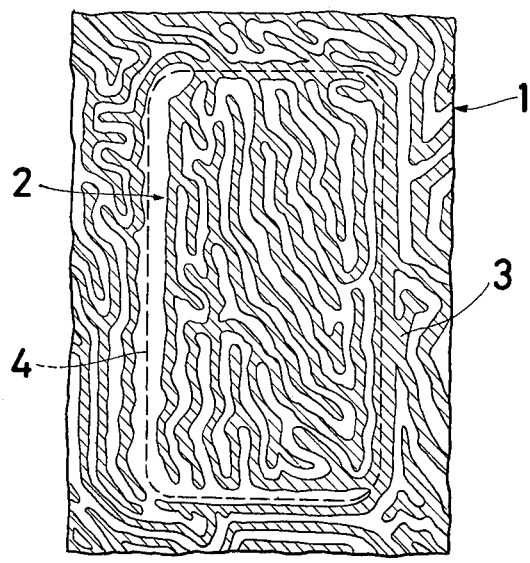
FIG. 3 is an explanatory view showing a magnetic strip domain of maze pattern in a magnetic material having an ion-implanted region, FIG. 4, including 4A and 4B, is an explanatory view showing a variety of magnetic strip domain patterns resulting from the application of a magnetic field to the magnetic material of FIG. 3.

Returning to FIG. 1, an ion-implanted region 2 is formed locally in a portion of a surface of a magnetic material 1 such as ortho-ferrite or garnet. The ion implantation can be carried out using protons or such ions as helium, lithium, argon, neon and xenon. Since the magnetic properties of the portion are changed by implanting ions thereto, the magnetic conditions which affect magnetic domains are changed. This is clear from a comparison of FIG. 2 and FIG. 3. FIG. 2 shows the magnetic domain patterns in a magnetic material having no ion-implanted region as observed with a polarizing microscope. FIG. 3 shows the magnetic patterns in a magnetic material having an ion-implanted region. As can be seen, the magnetic domain pattern which appears in the uniform magnetic material without an ion-implanted region (FIG. 2) is a maze pattern of random arrangement whereas the magnetic domain pattern which appears in a magnetic material having an ion-implanted region (FIG. 3) is not totally random.

That is, in FIG. 3, where an ion-implanted region 2 is formed in a magnetic material 1, a pattern is seen within a certain region along the boundary 4 between the ion-implanted region 2 and the unimplanted region where strip domains 3 in the vicinity of the boundary 4 lie in parallel to the boundary while those of the remainder of the magnetic material ramain in a maze pattern. FIG. 3 shows such a pattern in a magnetic material, $Gd_{0.5}Y_{2.5}GaFe_4O_{12}$, partially implanted with 200 keV helium ions at a dosage of $10^{16}/cm^{-2}$.

Figure 4A:
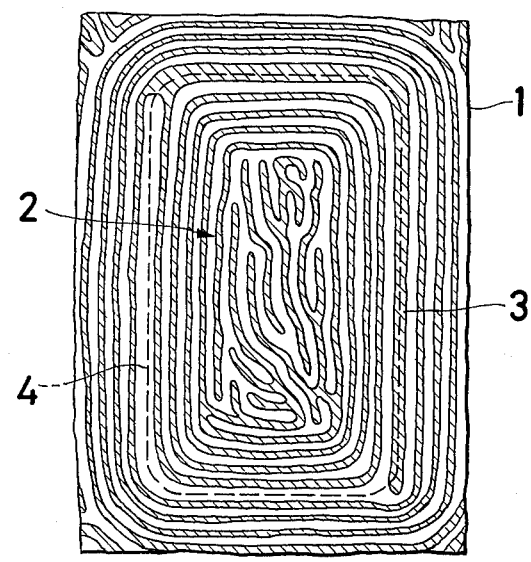
Figure 4B:
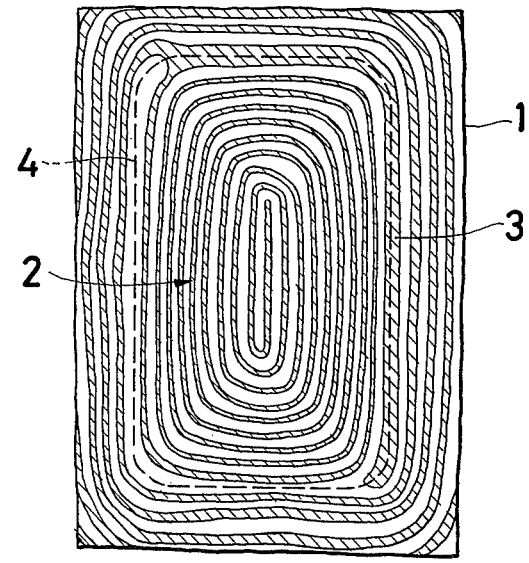

When a rotating in-plane magnetic field B is applied to the magnetic material, the maze pattern is aligned gradually along the boundary between the ion-implanted region 2 and the unimplanted region, resulting in a convolute magnetic strip domain pattern extending along the inside and outside of the boundary as shown in FIGS. 4(A) and 4(B).

FIG. 4(A) shows a typical domain pattern in the same magnetic material as described with respect to FIG. 3 at no bias magnetic field, and after 4 cycles of an in-plane rotating magnetic field of about 15 oe.

FIG. 4(B) shows a typical domain pattern, after 10 cycles of the in-plane rotating field, which gives complete convolute magnetic strip domain patterns both in and out of the ion-implanted region 2.

Figure 5:
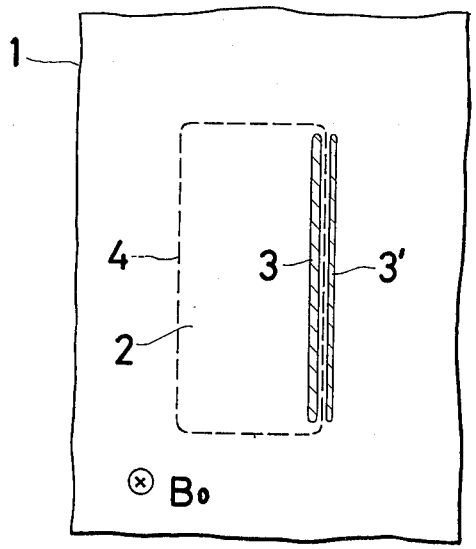
FIG. 5 is a schematic view showing examples of magnetic domain patterns produced by the method of the present invention.

The direction of this convolution can arbitrarily be selected by selecting the direction of rotation of the in-plane magnetic field applied thereto. The direction of convolution within the ion-implanted region is opposite to that outside of the region and this pattern remains even after the applied in-plane magnetic field is removed. Accordingly, it is possible to store information in the magnetic material in the form of patterns having certain shapes and orientations. That is, it is possible to control the orientation of the strip domain 3 along the boundary 4 between the ion-implanted region 2 and unimplanted region. When a bias magnetic field $B_o$ is applied normally to the surface of the magnetic material 1, the magnetic strip domain 3 is reduced and located along the boundary as shown in FIG. 5. This strip domain can be made to exist either on the ion-implanted region 2 of the boundary 4 as shown by 3 in FIG. 5 or on the other side of the boundary as shown by 3' in FIG. 5. The region where the magnetic strip domain exists can be chosen arbitrarily by selecting the kind of ions, the strength of the bias magnetic field, the strength of the rotating magnetic field and the rotating speed thereof etc. Thus, the generation of at least one magnetic strip domain is possible along the boundary.

When a uniform bias magnetic field is applied normally to the surface of the magnetic material and further an in-plane magnetic field parallel with the surface of the magnetic material is applied to the magnetic material, a magnetic strip domain is also generated at the boundary 4 between the ion-implanted region 2 and the unimplanted region. Such magnetic strip domain can also be generated by applying an in-plane magnetic field to the magnetic material together with a bias magnetic field and by decreasing the bias magnetic field. If an alternating magnetic field is used as the in-plane magnetic field, it is possible to generate magnetic strip domain 3 or 3' similar to that shown in FIG. 5 and the unimplanted region at a specific portion of the boundary between the ion-implanted region or to annihilate such domain. For example, in the case of FIG. 5, when an alternating in-plane magnetic field is applied to the magnetic material, the generation and annihilation of magnetic strip domains will occur on both sides of the boundary 4. Accordingly, when an in-plane magnetic field is applied in a specific direction, a magnetic strip domain 3 or 3' can be generated at a specific position of the boundary between the ion-implanted region and the unimplanted region. Further when a static in-plane magnetic field is applied to the magnetic material together with a rotating in-plane magnetic field, it is possible to move the magnetic strip domain back and forth along the boundary of the ion-implanted region.

Figure 6A:
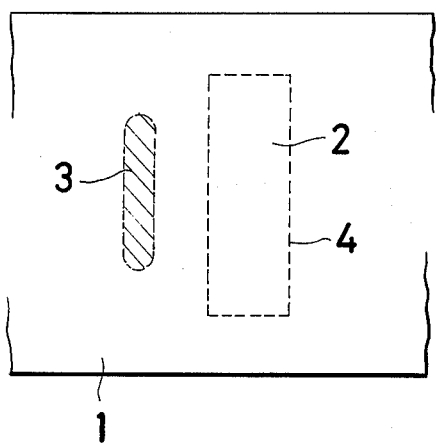
FIG. 6(A) and FIG. 6(B) illustrate a method for annihilating the magnetic strip domain.
Figure 6B:
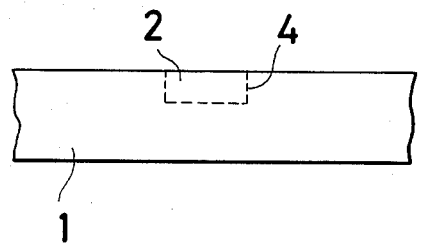
Figure 7:
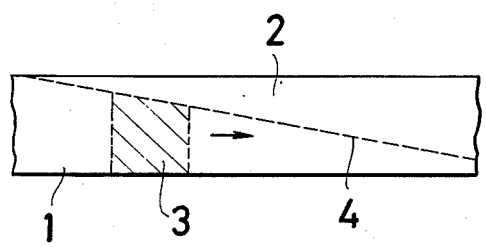
FIG. 7 illustrates another method for annihilating the magnetic strip domain.

Further, as shown in FIG. 6, such magnetic strip domain 3 can be annihilated by providing a region 2 in which ions are implanted heavily up to a certain depth in the magnetic material 1, collapsing the magnetic properties of the region 2 and then shifting a magnetic strip domain 3 to the region 2 by a suitable means. Since the size of the magnetic domain is substantially of the same thickness as the magnetic material, with an arrangement having an ion-implanted region the depth of which varies gradually from position to position, the size of the magnetic strip domains decreases gradually as it moves in the direction shown by the arrow in FIG. 7 and the magnetic domain collapses at the portion of the region 2 having a sufficient depth.

Since the magnetic properties of the ion-implanted region are different from those of the unimplanted region, magnetic domains existing in the two regions when they are under application of a bias magnetic field $B_o$ normal to the surface of the magnetic material are different from each other. That is, for example, it is possible to generate magnetic strip domains in the unimplanted region while there is no such domain in the implanted region 2. Further, under such condition, when the bias magnetic field is inversed, the condition of the magnetic strip domains is maintained and when the inversed bias magnetic field strength is increased, magnetic strip domains are abruptly generated in the ion-implanted region 2. This phenomenon permits the magnetic material to be used as a kind of switch or a memory because of its threshold property. If when an alternating magnetic field is used as the bias magnetic field, the generation and annihilation of the magnetic strip domains within the ion-implanted region 2 are delayed and so this phenomenon permits the magnetic material to be used as a delay device.

For a sample material made by locally implanting proton or helium ions at a dosage of about $10^{16}cm^{-2}$ in garnets $Gd_{0.5}Y_{2.5}GaFe_4C_{12}$ and $EnEr_2Ga_{0.7}Fe_{4.3}O_{12}$, it was found that it is possible to control the magnetic strip domains in all the manners mentioned above.

Figure 8A:
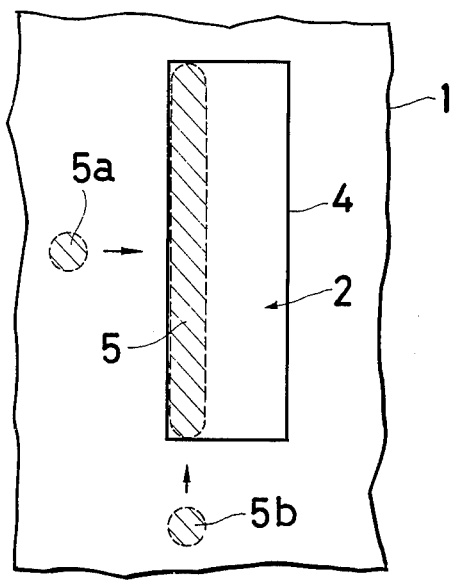
FIGS. 8(A) to 8(D) illustrate a method for producing a magnetic strip domains by using a magnetic bubble.
Figure 8B:
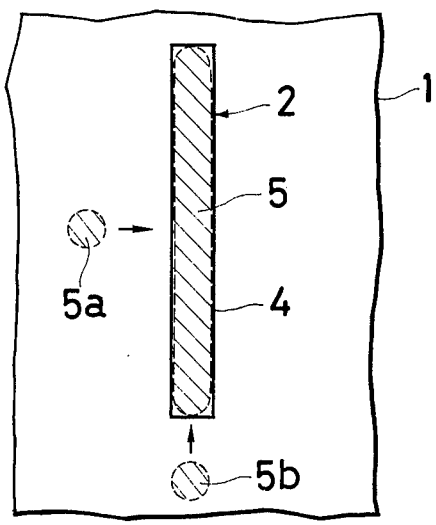

FIGS. 8(A) to 8(D) illustrate a method for generating a magnetic strip domain from a magnetic bubble domain. The magnetic strip domain previously existing in the magnetic material 1 was annihilated in the manner previously described. Firstly, a magnetic bubble domain 5a or 5b was generated outside of the ion-implanted region 2 by applying a bias magnetic field normal to the surface of the magnetic material 1. The magnetic bubble domain was moved to the ion-implanted region by means of a known driving circuit (not shown) and when it approached the region 2 it expanded along the boundary 4 of the region resulting in a magnetic strip domain 5. That is, where the width of the ion-implanted region 2 is substantially larger than the diameter of the magnetic bubble domain 5a or 5b as shown in FIG. 8(A), the magnetic bubble domain is expanded along one of the boundary edges of the region, while, where the width of the region is substantially the same as the diameter of the bubble domain as shown in FIG. 8(B), the magnetic bubble domain is expanded substantially fully in the region.

Figure 8C:
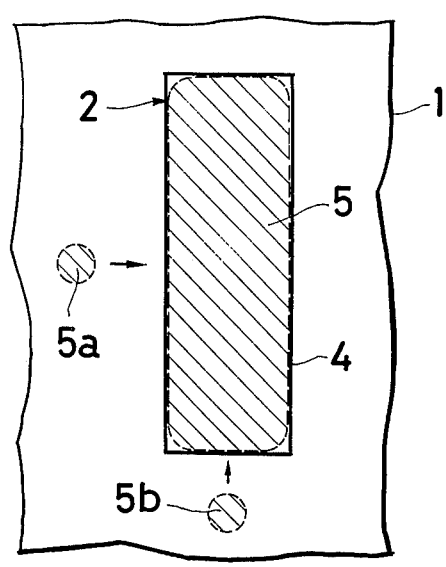

Further, by selecting the kind of ions, the dosage thereof and the bias magnetic field, it is possible to cause the magnetic bubble domain 5a or 5b so as to occupy fully an ion-implanted region 2 having a width much larger than the diameter of the magnetic bubble domain as shown in FIG. 8(C).

Figure 8D:
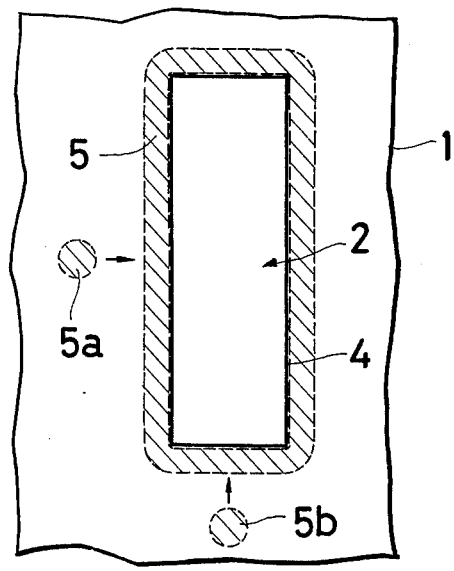

For example, where helium ions are implanted, it is possible to obtain a magnetic strip domain 5 having width larger than the diameter of the magnetic bubble domain 5a or 5b. Further, it is also possible to expand the magnetic bubble domain 5a or 5b along a portion or all of the peripheral edge of the ion-implanted region to form a magnetic strip domain 5 surrounding the region as shown in FIG.8(D).

Figure 9:
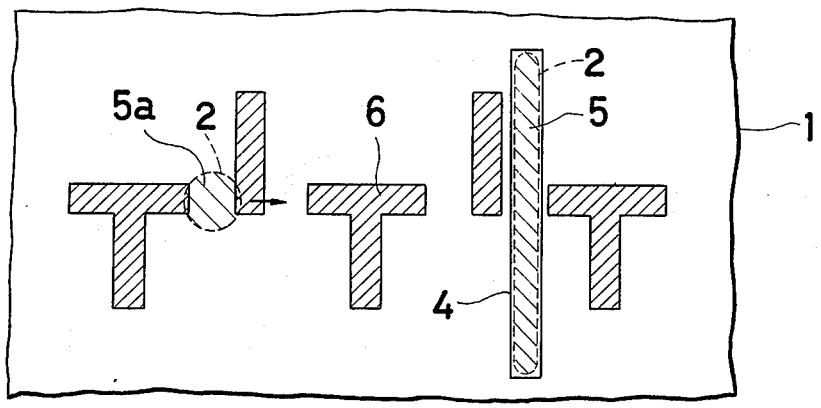
FIGS. 9 and 10 show embodiments of the present invention each of which uses a T-shaped bar of Permalloy as a driving circuit for the magnetic bubble domain.
Figure 10:
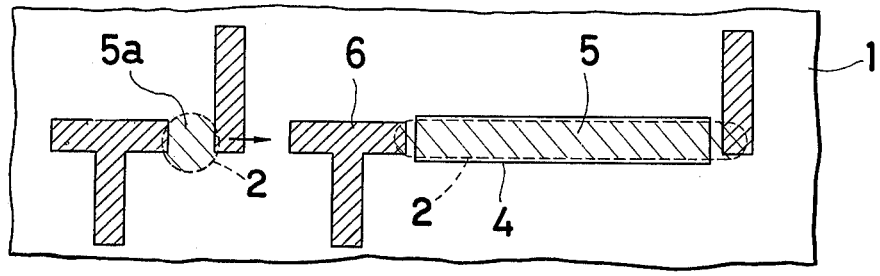
Figure 11:
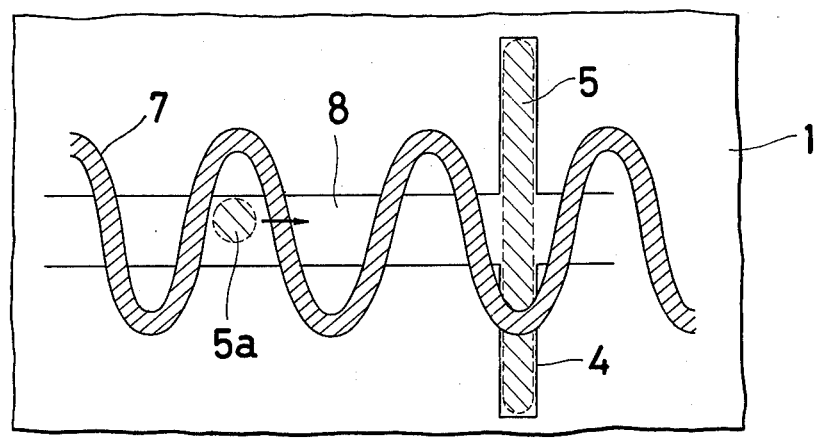
FIG. 11 shows another embodiment in which a magnetic bubble domain is driven by a corrugated conductive wire.
Figure 12:
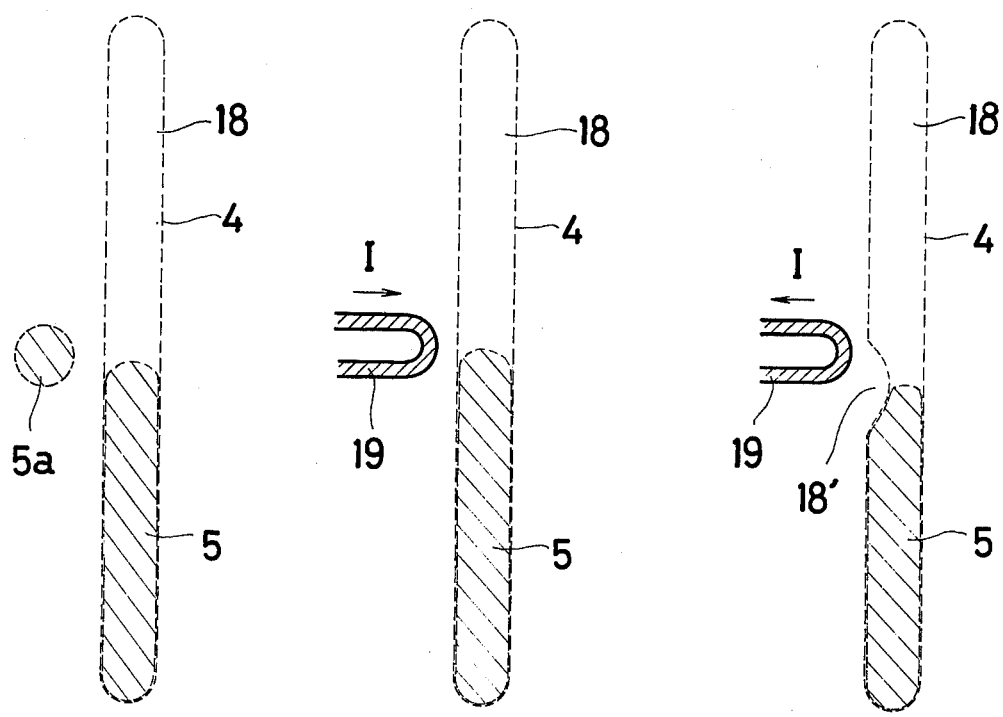
FIG. 12 is an explanatory view showing the principle used in controlling the magnetic strip domain.

FIGS. 9 and 10 show embodiments each using a T-shape bar 6 of Permalloy as a driving circuit for the magnetic bubble domain 5a. The magnetic bubble domain 5a is driven rightwardly by the magnetization of the T-shape bar 6 upon the application of a rotating in-plane magnetic field, and stretched when it approaches the ion-implanted region 2. FIG. 9 shows a case where the magnetic bubble domain 5a is stretched in a direction normal to the moving direction thereof and FIG. 10 shows another case where the bubble domain 5a is stretched in the moving direction thereof whereby transfer of information is made very much faster than in a conventional case. FIG. 11 shows an embodiment in which the magnetic bubble domain 5a is driven by a corrugated conductive wire 7. In this embodiment, the ion-implanted region 2 is provided normal to the path 8 of the magnetic bubble domain 5a and, when the magnetic bubble domain approaches the region 2, it is stretched as shown in FIg. 12. The path 8 may be formed by reducing the thickness of the magnetic material by sputter etching or ion-implantation.

As an example, a magnetic material of epitaxial garnet was ion-implanted with protons at a dosage of $18^{16}cm^{-2}$ under an acceleration voltage of 200KV. In this example, a magnetic bubble domain having diameter of about $10\mu m$ was immediately stretched into a magnetic strip domain having a length of $200\mu m$. In another example, where helium ions are implanted at a dosage of $10^{16}cm^{-2}$ under an acceleration voltage of 240KV, the magnetic bubble domain was stretched into a magnetic strip domain having a length of $200\mu m$ and a width of $30\mu m$ as shown in FIG. 8(C). Further, by regulating the direction of the bias magnetic field and the intensity thereof, a magnetic strip domain 5 surrounding the ion-implanted region 2 was formed by stretching the magnetic bubble domain 5a as shown in FIG. 8(D).

Figure 13:
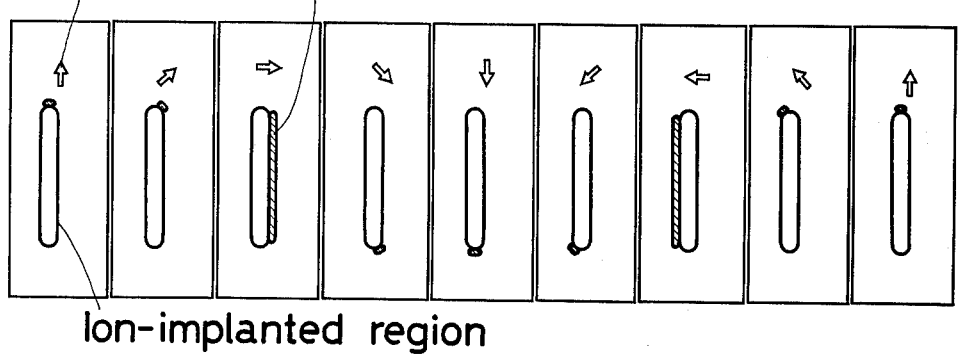
FIG. 13 is a explanatory view illustrating the movement of a bubble as it is stretched around the ion-implanted region by a rotating magnetic field.
Figure 14:
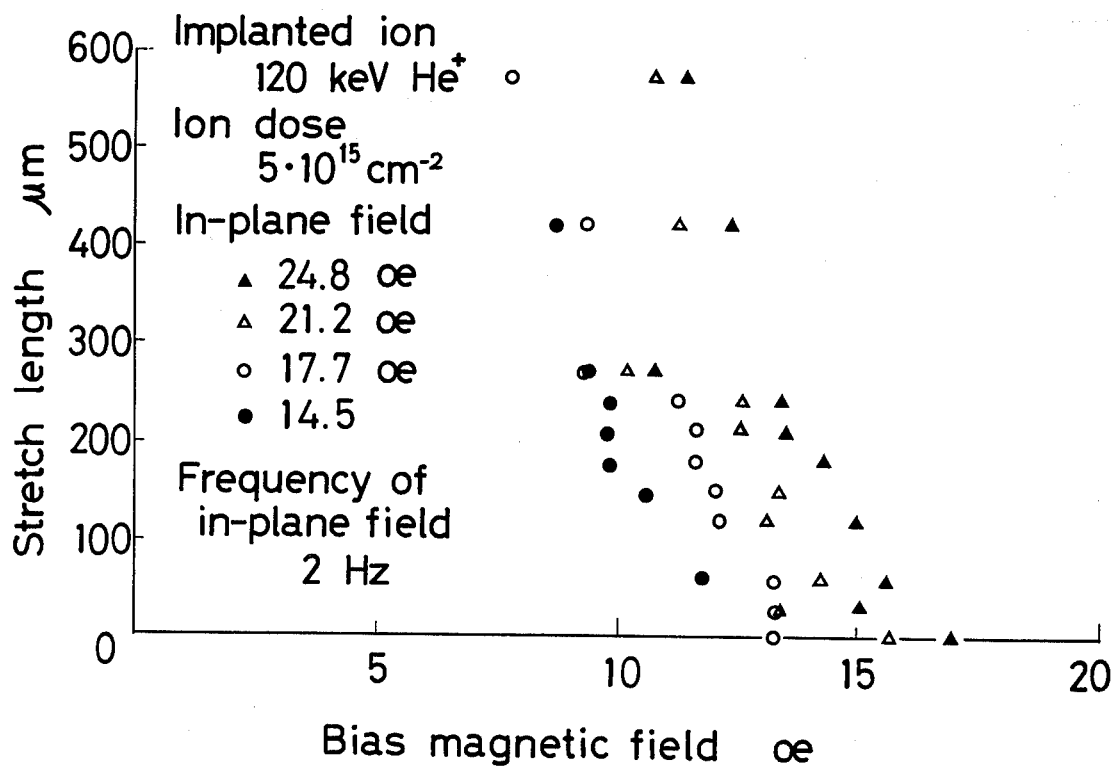
FIG. 14 is a diagram showing the experimentally determined relationship between stretching length and bias magnetic field.

FIG. 13 shows such an example, in which the bias magnetic field was set at 13.5 oe. In this condition, if a certain rotating in-plane magnetic field is applied, the bubble moves around the implanted region, and a stretching of the bubble takes place along the straight line edge of that implanted region. In a higher rotating field magnetic bubbles can stretch longer, but in a higher bias field stretching becomes less noticeable. Experimentally determined relationships between the stretching length and the bias magnetic field are shown in FIG. 14.

A typical example of the dependence of the upper limit of the bias magnetic field on frequency in a case of stretching bubbles a specified length ($570\mu m$ in the present case) is shown in FIG. 15.

When a detector is provided on the magnetic strip domain thus obtained by stretching and expanding the magnetic bubble domain, it is possible to derive a considerable output from the detector. As a result of the ion-implantation in accordance with the present invention, the magnetic bubble domain can be instantly shifted by a long distance due to the stretching thereof. Actual stretching velocities of 10m/sec or more were observed. Thus the shifting velocity in accordance with this invention is at least 100 times that obtainable by the conventional method in which the magnetic bubble domain is shifted bit by bit by a rotating magnetic field.

The stretching of a magnetic strip domain can be controlled by applying a local magnetic field near the path of stretching of the magnetic strip domain. FIG. 12 shows the principle. When a local magnetic field which repulses the magnetic strip domain is applied by bringing a magnetic bubble domain 5a near the path 18 of stretching (FIG. 12(A)) or by passing a current of a certain direction through a wire provided near the stretching path, the stretching of the magnetic strip domain 5 in inhibited. On the contrary, if the boundary 4 between the ion-implanted region and theh unimplanted region has a local variation 18' in the magnetic property or shape, or is provided locally with another magnetic material 19, the stretching of the magnetic strip domain is disturbed. Such a local variation in magnetic property can be made by selectively changing the ion species, energy or dose. However, if a local magnetic field is applied to promote the stretching of the magnetic strip domain at such a position. The disturbance is removed and the magnetic strip domain can stretch to the full extent. FIG. 12(C) shows an example, in which the direction of the current is reversed to promote the stretching of the magnetic strip domain.

A detection method of a magnetic strip domain in a magnetic material will now be described.

Figure 16A:
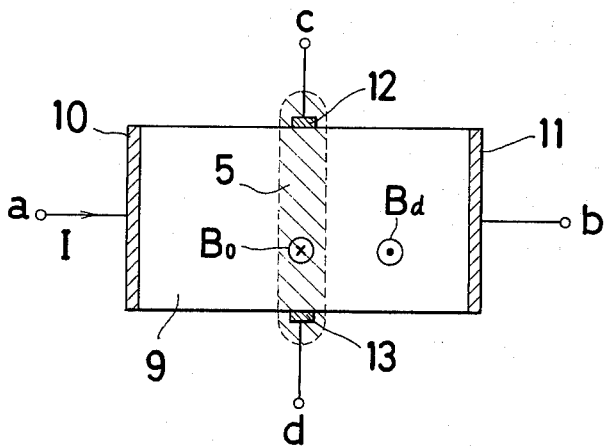

FIG. 16 shows the principle of the detection method according to the present invention. A rectangular semiconductor plate 9 has current electrodes 10 and 11 and Hall output electrodes 12 and forms a Hall element. Let us assume that the sensitivity of the Hall element is K. When a current I is introduced to the Hall element as shown in FIG. 16, and the Hall element is subjected to no magnetic strip domain but to a uniform bias magnetic field $B_d$, then, a Hall voltage $V_o$ given by $V_o = K \cdot B_d \cdot I$ is produced. However, when a magnetic strip domain 5 which produces a magnetic field $B_o$ is located across the Hall output electrodes 12 and 13 as shown in FIG. 16(A), a Hall voltage $V_d$ expressed as $V_d = K \cdot B_o \cdot I$ and having the opposite polarity is produced across the Hall output electrodes 12 and 13, because the direction of the magnetic field $B_o$ in the strip domain area is opposite to that of the bias magnetic field $B_d$. Therefore an output voltage $V_{out}$ for the magnetic strip domain 5 is the difference between the Hall voltages $V_o$ and $V_d$ and is given by $$V_{out} = V_o - V_d = K(B_d - B_o)I = K(B_d + |B_o|)I \quad (1)$$

The voltage $V_{out}$ becomes in fact very high because the directions of the magnetic fields $B_d$ and $B_o$ are opposite. In practice, the output voltage $V_{out}$ becomes slightly lower than the theoretical value expressed by the equation (1), because of the geometrical effect.

Figure 16B:
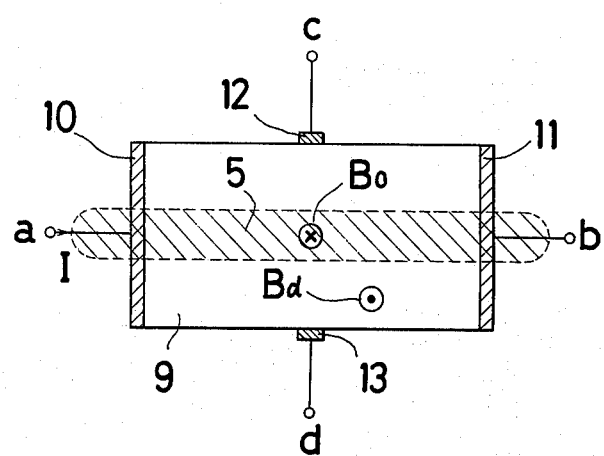

When the strip domain 5 is located on the Hall element across the current electrodes 10 and 11 thereof as shown in FIG. 16(B) the Hall voltage $V_d$ across the Hall electrodes 12 and 13 is given by $$V_d = K \left( B_d \cdot \frac{w-d}{w} + B_o \cdot \frac{d}{w} \right) I \quad (2)$$

where $w$ is the width of the Hall element and $d$ is the width of the strip domain, while when there is no magnetic strip domain on the Hall element, the Hall output voltage $V_o$ is $$V_o = K \cdot B_d \cdot I \quad (3)$$

Therefore, the output voltage of the element due to the presence of the magnetic strip domain 5 is the difference between the equations (2) and (3) and is represented as follows:

$$V_{out} = V_o - V_d = K \left( B_d \cdot \frac{d}{w} - B_o \cdot \frac{d}{w} \right) I$$

$$= K \cdot \frac{d}{w} (B_d - B_o) I$$

$$= K \cdot \frac{d}{w} (B_d + |B_o|) I \quad (4)$$

Since, in the above case, the Hall element is a semiconductor, non-magnetic material, its presence does not affect the behavior of the magnetic bubble domain and/or magnetic strip domain. Further, since a Hall element produces an output only by the magnetic field component normal to the surface of the Hall element, no noise is produced in the present invention by the rotation in-plane magnetic field for driving these domains.

Figure 17A:
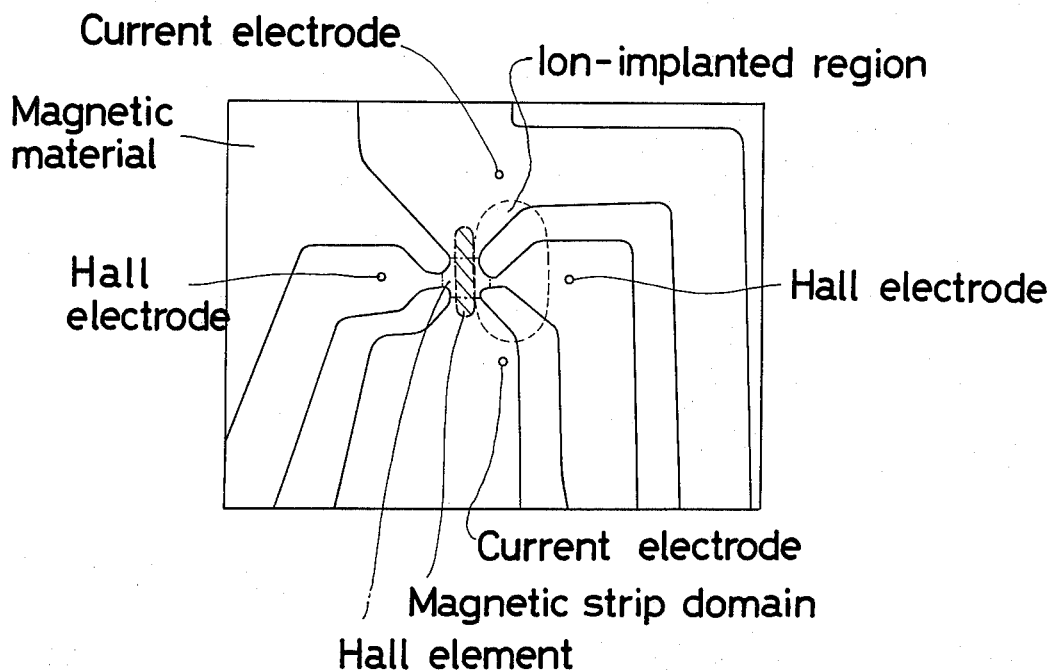
FIG. 17(A) shows one embodiment for detecting the magnetic strip domain by using a Hall element.
Figure 17B:
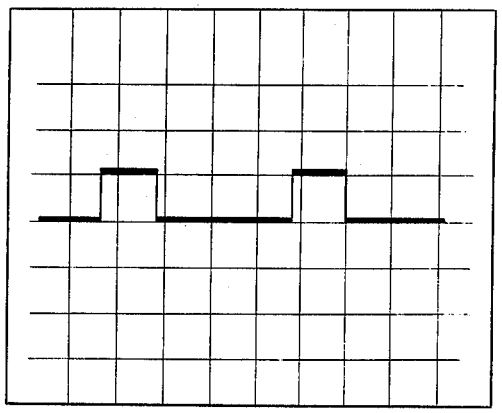
FIG. 17(B) is a diagram showing a pulse generated by the embodiment of FIG. 17(A), FIGS. 18 and 19 show examples of magnetic strip domain arrangement in a Hall element.

A typical way of applying the above mentioned stretched magnetic strip domain is to locate a stretched domain on the center of a Hall element in line with the current direction. Experiments were performed with an InSb Hall element for a stretched domain in a garnet film at a bias magnetic field of 10 oe and at a rotating in plane field of 15 oe at 1.2 kHz. The arrangement is shown in FIG. 17(A). Dynamic detection of a stretched domain at the straight line edge of a helium ion implanted Ne region gave a 0.5 mV output voltage at 10 mA with an excellent S/N ratio better than 30dB as shown in FIG. 17(B). This output voltage is about 5 times as much as the output obtained with a magnetic bubble domain in the same material under the same magnetic bias.

As will be clear from the above mentioned principles and example of the present invention, the detection method of the magnetic strip domain according to the present invention has advantages in that not only the presence or absence of a magnetic strip domain but also the strength, the size, the number the arrangement and the shape thereof can be detected by the value of the Hall voltage.

Although, in the above description, a typical orientation of the magnetic strip domains relative to the Hall element was described, other arrangements can be employed within the scope of the present invention provided that the magnetic strip domain locally affects the Hall element.

Figure 18:
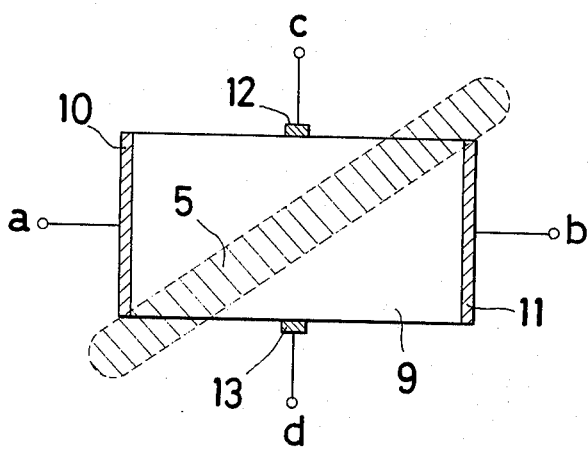
Figure 19:
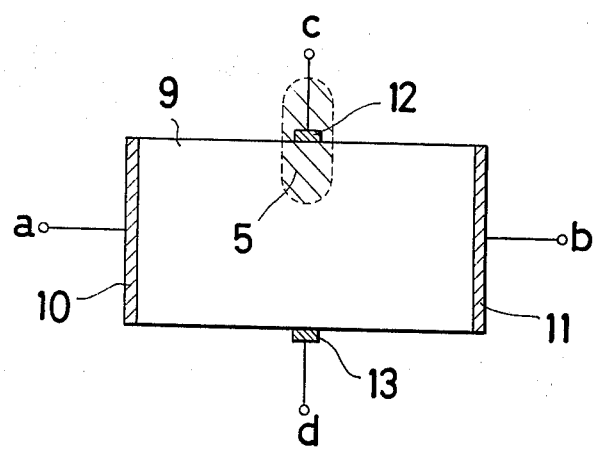

For example, the same effect as obtained by the previous arrangement can be obtained in a case where the magnetic strip domain 5 is located diagonally across the Hall element as shown in FIG. 18. Further, it is possible to arrange the magnetic strip domain so that it does not traverse the entire Hall element but affects only a portion thereof as shown in FIG. 19.

Figure 20A:
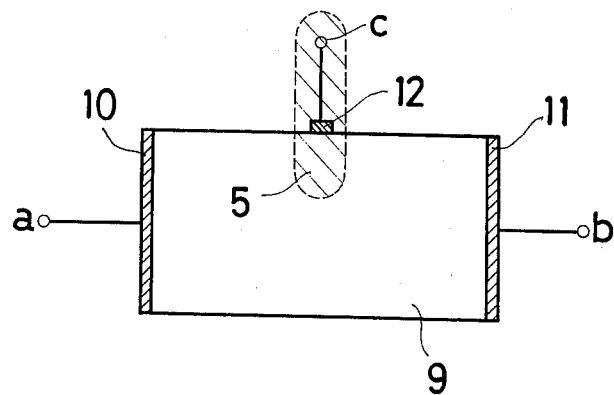
FIGS. 20(A) and 20(B) shows other Hall elements each having three terminals.
Figure 20B:
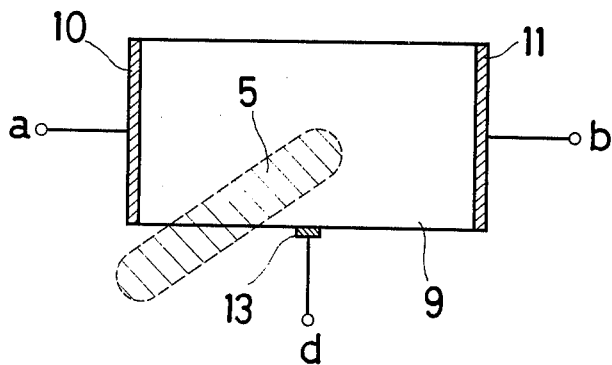

While, in the above examples, the Hall element has four terminals, it is possible to employ a three terminal Hall element as shown in FIG. 20(A) and 20(B) just in the same way as described above. The shape of Hall element does not necessarily have to be rectangular, and other shapes including a cross shape may also be used.

Figure 21:
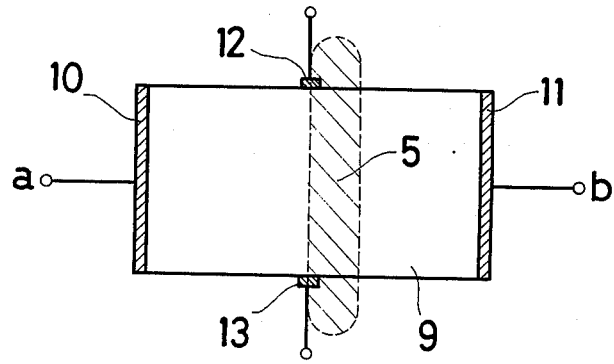
FIG. 21 shows a specific arrangement of magnetic strip domains in a Hall element.

Further, when an edge of the magnetic strip domain 5 is located to just cover both the Hall output electrodes 12 and 13 as shown in FIG. 21, the Hall voltage $V_d$ becomes zero and, by using this phenomenon, the presence of the magnetic strip domain can also be detected.

When no external bias magnetic field is applied to the Hall element, two oppositely magnetized strip domains of equal area and strength are generated in the magnetic material. The present method is also applicable to this case. Further, when a plurality of Hall output electrode pairs each having the electrodes such as 12 and 13 are provided on the Hall element, the position of the magnetic strip domain therein is detectable without shifting the Hall element and, in addition to this, the intensity, the size and the arrangement of the magnetic strip domains are also detectable.

Logic devices utilizing the above mentioned method of control and detection of magnetic strip domains and capable of rapidly and efficiently processing information will be described hereinafter.

Figure 22:
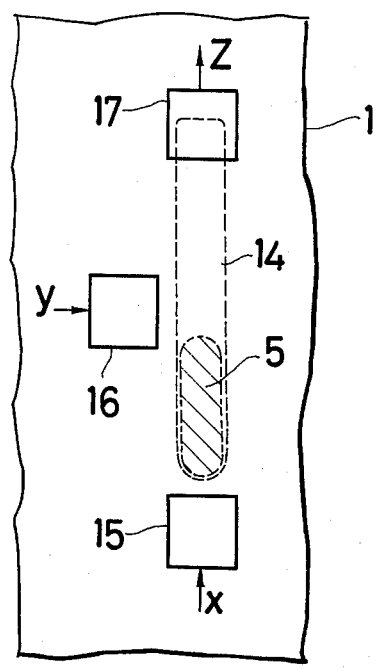
FIG. 22 shows an example of a device constructed in accordance with the present invention.

FIG. 22 shows an example of a device which comprises a magnetic material 1, an ion implanted region thereon which is used as a magnetic strip domain generating and stretching region 14, a magnetic strip domain generating means 15 provided at one end or adjacent to one end of the magnetic strip domain generating and stretching region 14, a magnetic strip domain generating and stretching region 14, a magnetic strip domain control means 16 provided near the path of the region 14 and a magnetic strip domain detecting means 17 provided at the other end of the region 14. The strip domain generating means 15 is of the type described previously. The magnetic strip domain 5 produced by the means 15 upon the application an input ($x=1$) thereto will grow along the region 14. However, by applying another input ($y=1$) to the control means 16, the growth of the magnetic strip domain is prevented from growing any further.

When no input is applied to the control means 16, the magnetic domain 5 will ultimately reach the position of the detecting means 17 and provide an output ($Z=1$).

In this example, the output Z constitutes the result of a logic operation of two inputs $x$ and $y$. That is $Z=x\cdot\sim y$, where $\sim y$ represents a negation of $y$. Therefore, this device can operate as an INHIBITER logic operation.

Figure 23:
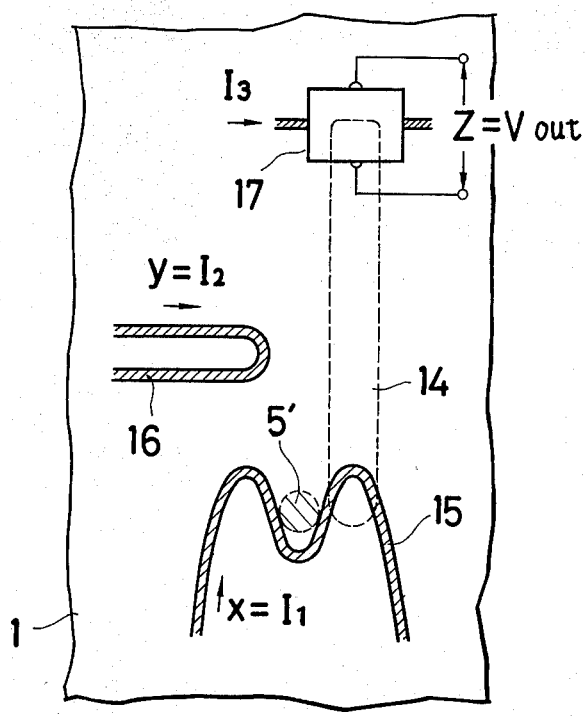
FIG. 23 shows another example of a device constructed in accordance with the present invention.

FIG. 23 shows another example in which a magnetic strip domain generating region 14 is provided locally on a magnetic material 1 by ion implantation. As a magnetic strip domain generating means 15 there is provided a conductive wire so that when a current I is passed, therethrough, a magnetic strip domain is generated.

In the embodiment shown in FIG. 23, the magnetic strip domain generating means comprises a conductive wire in which a current $I_1$ flows, and the magnetic strip domain control means 16 also comprises a conductive wire through which a current $I_2$ is supplied. The magnetic domain detecting means 17 is constituted with a semiconductor Hall element and the output of the means corresponds to the output voltage $V_{out}$ of the Hall element when a current $I_3$ is supplied therethrough. When a signal current $I_1$ is supplied to the device, a magnetic bubble domain 5' is shifted to the magnetic strip domain generating region where is grows into a magnetic strip domain. The growth of the magnetic strip domain is either inhibited by the magnetic field caused by the current $I_2$ or, if current $I_2$ is not present, the magnetic strip domain reaches the position of the detecting means at which it is detected as an output voltage $V_{out}$ of the Hall element having the current $I_3$. If the current $I_2$ representing $y$ has not been supplied before the current $I_1$ representing $x$ is supplied to generate the magnetic strip domain, the output $Z=V_{out}$ is produced, while if the current $I_2$ has been supplied, Z will be zero. This provides a logic operation of $Z=x\cdot\sim y$.

Figure 24:
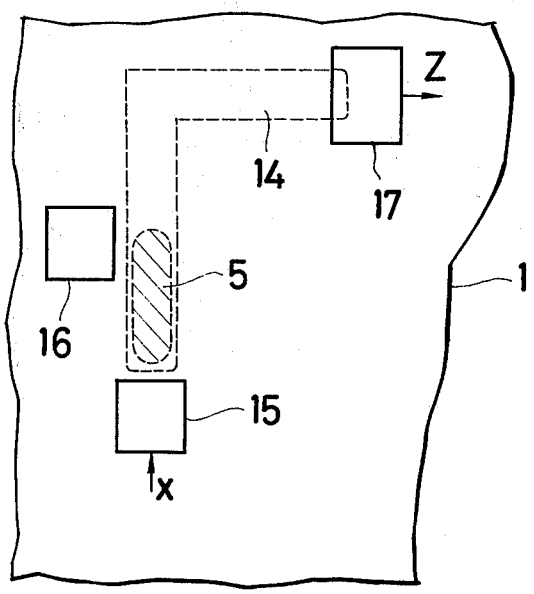
FIG. 24 shows an example of the shape of the ion-implanted region.

The shape of the magnetic strip domain generating region 14 is not always linear and any shape including a shape such as shown in FIG. 24 may be employed.

Figure 25:
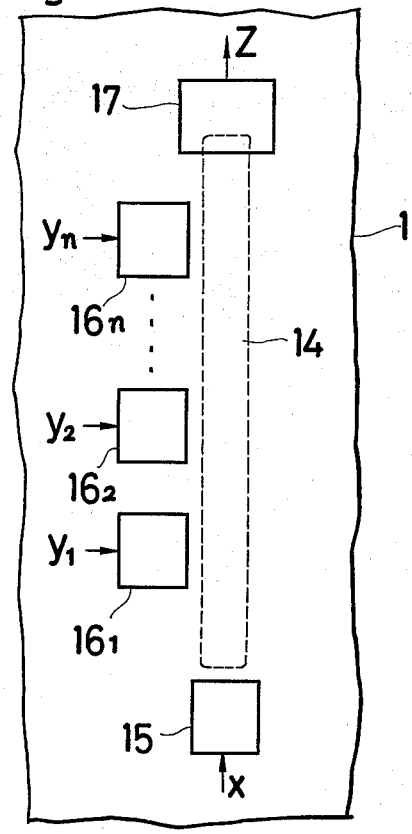
FIG. 25 shows another device constructed in accordance with the present invention.

FIG. 25 shows an embodiment which is provided with a plurality of magnetic strip domain control means $16_1$, $16_2$, ... $16_n$. In this embodiment the output Z is zero if any of the inputs $Y_1$, $Y_2$, ... $Y_n$ of the respective control means has an input signal. That is, this arrangement provides a logic operation $Z=\sim y_1\cdot\sim y_2\cdot\sim y_3 \ldots \cdot\sim y_n$.

As the magnetic strip domain control means there be used either a means having the ability to inhibit the growth of the magnetic strip domain or one having the ability to promote the growth thereof.

Figure 26:
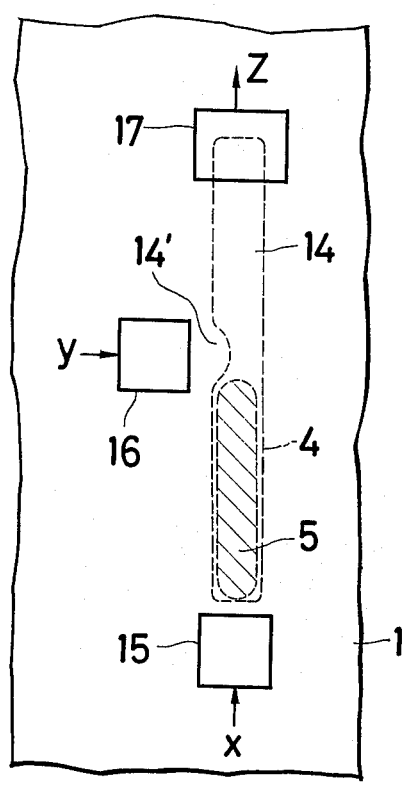
FIG. 26 shows a further example of a device constructed in accordance with the present invention.

In the embodiment shown in FIG. 26, the width of the magnetic strip domain generating and stretching region 14 is slightly reduced at an intermediate portion thereof in order to create a suppressing portion 14' for suppressing the growth of the magnetic strip domain 5 generated at the magnetic strip domain generating means 15, so that the magnetic strip domain cannot reach the position of the magnetic domain detecting means 17. However, by providing in the vicinity of the suppressing portion 14' a magnetic strip domain control means 16 which acts to promote the growth of the strip domain and by applying a signal to the means 16, a further stretching of the magnetic strip domain 5 can be achieved. As the means 16 for promoting the growth of the magnetic strip domain, a mechanism of substantially the same construction as that shown in FIG. 23 may be employed.

In this case, the direction of the current supplied to the conductive wire should be opposite to that in the case of FIG. 23 which is intended to inhibit the growth.

On the other hand, it is possible to construct the control means 16 with suitable patterns of another magnetic material such as Permalloy. In this case, the magnetization of the other magnetic material, when used to promote the growth of the strip domain, should be opposite to that when used to inhibit the growth. As shown in FIG. 26, when the control means is used to promote the growth, the output Z of the magnetic domain detecting means 17 shows $Z=x\cdot y$ and this provides an AND logic operation. This principle is also applicable to the case where there are a plurality of control means, resulting in the operation of $Z=x\cdot y_1\cdot y_2 \ldots \cdot y_n$.

Figure 27:
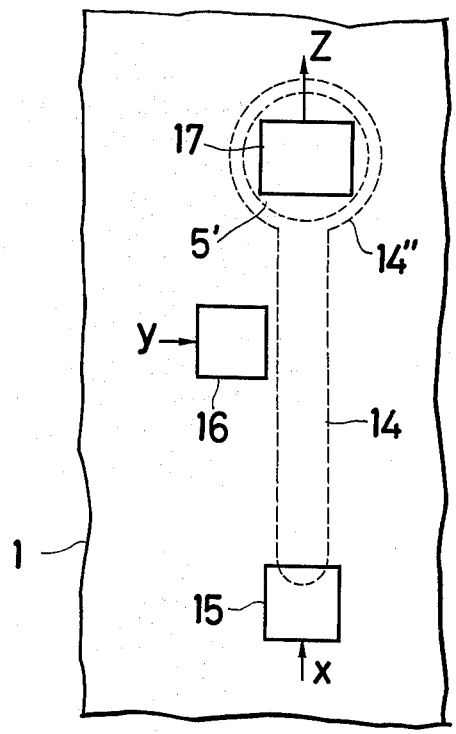
FIG. 27 is an modification of the device in FIG. 26, FIGS. 28(A) and 28(B) are equivalent circuits of the devices in FIGS. 22 and 26 respectively.

In the respective embodiments of the present invention which have been described, a modification can be made as shown in FIG. 27.

In the modification, one end portion of the magnetic strip domain stretching region 14 is deformed as shown to provide a circular domain converging region 14'' and the detecting means 17 is disposed thereon. The magnetic strip domain 5 generated by the generating means 15 and allowed to reach the converging region 14'' by the control means 16 becomes a large sized magnetic bubble domain 5'. By employing such arrangement, it is possible to make the detecting output larger and/or to erase the magnetic bubble domain 5' after the logic operation by means of, for example, shifting the magnetic bubble domain outward in the conventional manner.

Figure 28A:
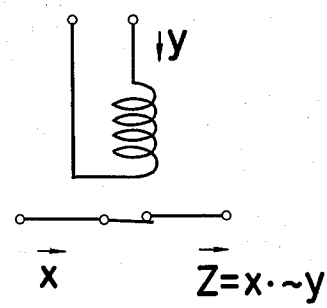
Figure 28B:
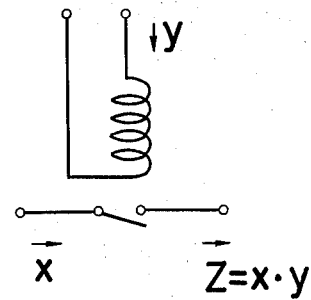

As will be clear from the forgoing, the effect of the present principle corresponds to the known relay. That is, the embodiment shown in FIG. 22 wherein the control means 16 acts to inhibit the growth of the magnetic strip domain corresponds to a relay having a break contact such as shown in FIG. 28(A) and the embodiment shown in FIG. 26 wherein the control means 16 acts to promote the growth corresponds to a relay having a make contact such as shown in FIG. 28(B).

Therefore, the logic devices of the present invention can be used in almost all conventional devices and/or circuits constituted with relays.

Figure 29:
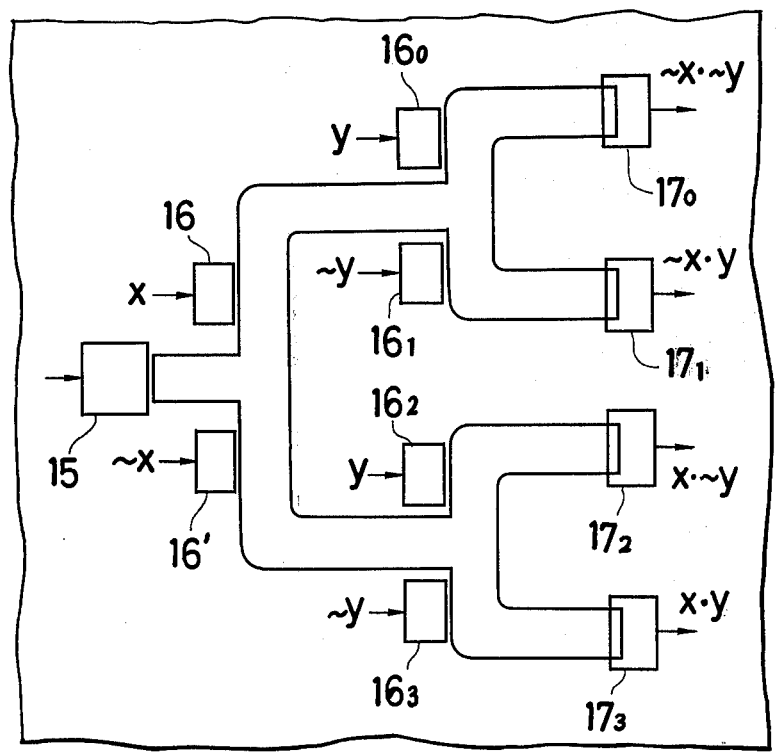
FIG. 29 is a further example of a device constructed in accordance with the present invention.

For example, the magnetic strip domain generating region 14 may be constituted as a tree having a trunk and branches extending from the trunk as shown in FIG. 29. In this case, magnetic strip domain generating means 15 is provided at the end of the trunk of the tree, magnetic strip domain detecting means $17_0$, $17_1$, $17_2$ and $17_3$ are provided at the end of the branches and the magnetic strip domain control means 16, 16', $16_0$, $16_2$ and $16_3$ are disposed at positions adjacent to the respective branching portions. Considering a construction in which the control means act to inhibit the growth of the magnetic strip domain if signals $x$, $\sim x$, $y$ and $\sim y$ are applied beforehand to selected control means as shown and a magnetic strip domain 5 is then generated at the end of the trunk by the generating means 15, the strip domain will be stretched along the particular one branch selected by pre-setting the control means, and an output will be derived from the associated detecting means 17. The device of this example thus acts as a decoder.

On the other hand where a plurality of magnetic strip domain generating means 15 are disposed at the respective ends of the branches and a detecting means 17 is disposed at the end of the trunk, the arrangement can be used as a selective detection device which can provide an output from the single detecting means by selecting the inputs, i.e., the generating means supplying a signal. In any of the aforementioned devices, a combination of the control means having the growth inhibiting property and the control means having the growth promoting property can be used. In this case these devices can be operated with only $x$ and $y$ signal inputs.

As will be clear from the forgoing, the magnetic domain detecting means 17 can detect either the magnetic strip domain 5 or the magnetic bubble domain 5' such as shown in FIG. 27.

As described in detail previously, the present invention provides a method by which the generation of a magnetic strip domains in a magnetic material, the extinction thereof, the transfer thereof and the control of the arrangement and stretching thereof, are achieved individually or in combination. The method comprises the application of an in-plane magnetic field and/or magnetic field normal to a surface of magnetic material which has an ion-implanted region. The important effects of the present method in comparison with the conventional method utilizing the Permalloy pattern are that the manufacture of the devices which embody the present method and which have conductive patterns and/or detectors thereon is easy because the surface of the magnetic material can be made flat and insulative, that the performance thereof is improved and that the reliability thereof is also improved. Further, according to the present method, the magnetic domains can be controlled as two dimensional patterns because domain patterns of any type including bubble and strip patterns as well as convolute patterns can be formed by the present method. Therefore, the present method is applicable to information processing devices such as analog pattern memories and analog operation devices etc.

In addition, according to the present invention, not only is it possible to detect the presence of magnetic strip domains very efficiently by a Hall element but is is also possible to detect the intensities, the number, the arrangements and the configulations of the magnetic strip domains. By combining such domain stretching phenomenon with a Hall element according to the present invention, it is possible to obtain a large output. Information processing by logic operations can also be performed by controlling the generation and the stretching of the magnetic strip domain by signals. Further, the devices constructed in accordance with the present invention can be used just in the same way as conventional relays and the present invention has wide application in information processing.

We claim:

1. A method of controlling magnetic strip domains comprising: putting magnetic material provided with at least one ion-implanted region under a bias magnetic condition which permits the existence of at least one magnetic strip domain in said magnetic material, and applying at least one control magnetic field to said magnetic material, whereby said magnetic strip domain is generated or controlled.

2. The method according to claim 1, wherein said control magnetic field is an in-plane magnetic field, whereby at least one magnetic strip domain is generated in said magnetic material.

3. The method according to claim 1, wherein said control magnetic field is an in-plane magnetic field, whereby at least one magnetic strip domain is annihilated in said magnetic material.

4. The method according to claim 1, wherein said control magnetic field is an in-plane magnetic field, whereby said at least one magnetic strip domain is generated from at least one magnetic bubble domain.

5. The method according to claim 1, wherein said control magnetic field is an in-plane magnetic field, whereby at least one magnetic bubble domain is generated from said at least one magnetic strip domain.

6. The method according to claim 1, wherein said control magnetic field is applied normal to the surface of said magnetic material and at a strength sufficient to annihilate said magnetic strip domain in the area surrounded by the boundary between said ion-implanted region and unimplanted region, whereby said magnetic strip domain in said area is annihilated and remains annihilated even after application of said control magnetic field is discontinued.

7. The method according to claim 6, wherein said control magnetic field is further applied normal to the surface of said magnetic material in the direction opposite that used for annihilating said magnetic strip domain, whereby said magnetic strip domain is regnerated and remains in existence even after application of said control magnetic field in the opposite direction is discontinued.

8. The method according to claim 1, wherein said control magnetic field is an in-plane magnetic field, whereby at least one magnetic strip domain is moved in said magnetic material.

9. The method according to claim 8, wherein said in-plane magnetic field is an alternating in-plane magnetic field, whereby at least one magnetic strip domain is moved back and forth along the boundary between said ion-implanted region and uniplanted region in said magnetic material.

10. The method according to claim 8, wherein said in-plane magnetic field is a rotating in-plane magnetic field, whereby said at least one magnetic strip domain is moved along the boundary between said ion-implanted region and unimplanted region in said magnetic material.

11. The method according to claim 10, wherein the rotation of said in-plane magnetic field is stopped, whereby said at least one magnetic strip domain is rearranged to have a pattern in alignment with said boundary between said ion-implanted region and unimplanted region in said magnetic material.

12. The method according to claim 1, wherein said at least one magnetic strip domain is stretched along the boundary between said ion-implanted region and unimplanted region by said control magnetic field.

13. The method according to claim 12, wherein at least one local magnetic field is applied near the path of stretching of said magnetic strip domain, whereby the stretching of said magnetic strip domain is controlled.

14. The method according to claim 13, wherein said at least one local magnetic field is generated by a magnetic bubble domain.

15. The method according to claim 13, wherein said at least one local magnetic field is generated by passing a current through a conductor.

16. The method according to claim 13, wherein said magnetic material is further provided with an inhibiting means to inhibit the stretching of said magnetic strip domain.

17. The method according to claim 16, wherein said inhibiting means is another magnetic material.

18. The method according to claim 13, wherein said magnetic material is further provided with an inhibiting region to inhibit the stretching of said magnetic strip domain.

19. The method according to claim 18, wherein said inhibiting region is made by a local variation in magnetic property of the boundary between said ion-implanted region and unimplanted region in said magnetic material.

20. The method according to claim 18, wherein said inhibiting region is made by a local variation in shape of the boundary between said ion-implanted region and unimplanted region in said magnetic material.

21. The method according to claim 13, wherein said magnetic material is further provided with a promoting means to promote the stretching of said magnetic strip domain.

22. The method according to claim 21, wherein said promoting means is another magnetic material.

23. The method according to claim 13, wherein said magnetic material is further provided with a promoting region to promote the stretching of said magnetic strip domain.

24. The method according to claim 23, wherein said promoting region is made by a local variation in magnetic property of the boundary between said ion-implanted region and unimplanted region in said magnetic material.

25. The method according to claim 23, wherein said promoting region is made by a local variation in shape of the boundary between said ion-implanted region and unimplanted region in said magnetic material.

26. The method according to claim 1 including in addition, detecting said magnetic strip domain in said magnetic material.

27. The method according to claim 26, wherein said magnetic strip domain in said magnetic material is detected by a Hall element a part of which is subjected to magnetic field from said magnetic strip domain.

28. The method according to claim 27, wherein the current flow of said Hall element is in parallel with said magnetic strip domain.

29. The method according to claim 27, wherein the current flow of said Hall element is at an angle with said magnetic strip domain.

30. The method according to claim 27, wherein the current flow of said Hall element is normal to said magnetic strip domain.

31. The method according to claim 27, wherein said Hall element has four electrodes.

32. The method according to claim 27, wherein said Hall element has three electrodes.

33. A logic device comprising: a magnetic material provided with at least one magnetic strip domain stretching region made by local ion-implantation, at least one means for generating at least one magnetic strip domain, at least one means for controlling the stretching of said at least one magnetic strip domain, and at least one detecting means for detecting said at least one controlled magnetic domain.

34. The logic device according to claim 33, wherein said generating means is a magnetic domain.

35. The logic device according to claim 33, wherein said generating means is a conductor.

36. The logic device according to claim 33, wherein said generating means is an in-plane magnetic field.

37. The logic device according to claim 33, wherein said control means is a magnetic domain.

38. The logic device according to claim 33, wherein said control means is a conductor.

39. The logic device according to claim 33, wherein said detecting means is a Hall element.

40. The logic device according to claim 33, wherein said magnetic strip domain stretching region has a local variation in magnetic property.

41. The logic device according to claim 33, wherein said magnetic strip domain stretching region has a local variation in shape.

* * * * *